US010950429B2

(12) United States Patent
Citla et al.

(10) Patent No.: US 10,950,429 B2
(45) Date of Patent: Mar. 16, 2021

(54) METHODS OF FORMING AMORPHOUS CARBON HARD MASK LAYERS AND HARD MASK LAYERS FORMED THEREFROM

(71) Applicant: Applied Materials, Inc., Santa Clara, CA (US)

(72) Inventors: Bhargav S. Citla, Fremont, CA (US); Mei-Yee Shek, Palo Alto, CA (US); Srinivas D. Nemani, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/396,167

(22) Filed: Apr. 26, 2019

(65) Prior Publication Data

US 2019/0348283 A1 Nov. 14, 2019

Related U.S. Application Data

(60) Provisional application No. 62/668,558, filed on May 8, 2018.

(51) Int. Cl.
*H01L 21/02* (2006.01)
*H01L 21/033* (2006.01)
(Continued)

(52) U.S. Cl.
CPC ........ *H01L 21/02266* (2013.01); *C23C 14/02* (2013.01); *C23C 14/0605* (2013.01);
(Continued)

(58) Field of Classification Search
CPC ......... H01L 21/02115; H01L 21/02266; C23C 14/34–354; C23C 14/228
See application file for complete search history.

(56) References Cited

U.S. PATENT DOCUMENTS 6,086,730 A * 7/2000 Liu ..................... C23C 14/0605
204/192.12
6,344,419 B1 2/2002 Forster et al.
(Continued)

FOREIGN PATENT DOCUMENTS

CN 103035513 B 10/2016
JP 63067721 A 3/1988

*Primary Examiner* — John A Bodnar
(74) *Attorney, Agent, or Firm* — Patterson + Sheridan LLP

(57) ABSTRACT

Embodiments described herein provide for post deposition anneal of a substrate, having an amorphous carbon layer deposited thereon, to desirably reduce variations in local stresses thereacross. In one embodiment, a method of processing a substrate includes positioning a substrate, having an amorphous carbon layer deposited thereon, in a first processing volume, flowing an anneal gas into the first processing volume, heating the substrate to an anneal temperature of not more than about 450° C., and maintaining the substrate at the anneal temperature for about 30 seconds or more. Herein, the amorphous carbon layer was deposited on the substrate using a method which included positioning the substrate on a substrate support disposed in a second processing volume, flowing a processing gas into the second processing volume, applying pulsed DC power to a carbon target disposed in the second processing volume, forming a plasma of the processing gas, and depositing the amorphous carbon layer on the substrate.

17 Claims, 7 Drawing Sheets

(51) Int. Cl.
C23C 14/06 (2006.01)
C23C 14/02 (2006.01)
C23C 14/35 (2006.01)

(52) U.S. Cl.
CPC ........ *C23C 14/35* (2013.01); *H01L 21/02115* (2013.01); *H01L 21/02356* (2013.01); *H01L 21/0332* (2013.01)

(56) References Cited

U.S. PATENT DOCUMENTS

| | | |
|---|---|---|
| 8,585,873 B2 | 11/2013 | Ford et al. |
| 9,695,503 B2 | 7/2017 | Stowell et al. |
| 2009/0183992 A1 | 7/2009 | Fredenberg et al. |
| 2010/0032838 A1* | 2/2010 | Kikuchi .............. H01L 21/0276 257/751 |
| 2011/0011737 A1 | 1/2011 | Wu et al. |
| 2011/0124192 A1 | 5/2011 | Ganguli et al. |
| 2011/0240464 A1* | 10/2011 | Rasheed .............. H01J 37/3411 204/298.06 |
| 2013/0256125 A1 | 10/2013 | Young et al. |
| 2015/0348824 A1 | 12/2015 | Kuenle et al. |
| 2016/0053366 A1 | 2/2016 | Stowell et al. |
| 2016/0372319 A1 | 12/2016 | Zeng et al. |
| 2018/0051368 A1 | 2/2018 | Liu et al. |
| 2018/0209037 A1 | 7/2018 | Citla et al. |

\* cited by examiner

METHODS OF FORMING AMORPHOUS CARBON HARD MASK LAYERS AND HARD MASK LAYERS FORMED THEREFROM

CROSS-REFERENCE TO RELATED APPLICATIONS

This application claims priority to U.S. Provisional Application Ser. No. 62/668,558 filed on May 8, 2018, which is herein incorporated by reference in its entirety.

BACKGROUND

Field

Embodiments of the present disclosure generally relate to methods used in semiconductor device manufacturing, and more particularly, to methods used to form an amorphous carbon hard mask layer on a substrate in an electronic device fabrication process.

Description of the Related Art

Carbon hard masks, formed of amorphous carbon layers, are well known and are commonly used in processes of record (POR) in semiconductor manufacturing. Unfortunately, processing issues caused by inherent properties of amorphous carbon layers deposited using conventional methods are expected to increase as a result of ongoing scaling of DRAM device structures to less than ~10 nm, which will require higher aspect ratio etching of device features such as deep contact holes or trenches. One such processing issue is related to poor uniformity in the local stress of the amorphous carbon layer across the substrate, herein designated as the degree of variation in local stress, or "local stress nonuniformity". Non-uniform (e.g., undulating in value) local film stress values across a substrate can cause one, or both, of undesirable localized pattern distortions and pattern overlay error during the lithography processes that are performed after the deposition of the amorphous carbon layer. Pattern distortion and overlay errors may require time consuming and thus costly rework of, or even failure of, the device.

Accordingly, what is needed in the art are methods of reducing local stress nonuniformity in amorphous carbon layers.

SUMMARY

Embodiments of the present disclosure generally relate to methods of reducing the local stress nonuniformity of an amorphous carbon layer which has been deposited on a substrate using a physical vapor deposition (PVD) process. In particular, embodiments described herein provide methods of annealing a substrate, having an amorphous carbon layer deposited thereon, to desirably reduce variation in local stresses thereacross.

In one embodiment, a method of processing a substrate includes positioning a substrate, having an amorphous carbon layer deposited thereon, in a first processing volume, flowing an anneal gas into the first processing volume, heating the substrate to an anneal temperature of not more than about 450° C., and maintaining the substrate at the anneal temperature for about 30 seconds or more. Herein, the amorphous carbon layer was deposited on the substrate using a method which included positioning the substrate on a substrate support disposed in a second processing volume, flowing a processing gas into the second processing volume, applying pulsed DC power to a carbon target disposed in the second processing volume, forming a plasma of the processing gas, and depositing the amorphous carbon layer on the substrate. Herein, the first processing volume is a processing volume of a first processing chamber and the second processing volume is a processing volume of a second processing chamber. In some embodiments, the first and second processing chambers are part of a multi-chamber processing system and are coupled by a transfer chamber disposed therebetween.

In another embodiment, a method of processing a substrate includes depositing an amorphous carbon layer and annealing the substrate. Depositing the amorphous carbon layer includes positioning the substrate on a substrate support disposed in a first processing volume, flowing a processing gas into the first processing volume, wherein the processing gas comprises an inert gas and a reactive gas comprising hydrogen, nitrogen, or a combination thereof, maintaining the substrate at a deposition temperature of about 200° C. or less, applying pulsed DC power to a carbon target disposed in the first processing volume, forming a plasma of the processing gas, and depositing the amorphous carbon layer on the substrate. Annealing the substrate includes positioning the substrate, having the amorphous carbon layer deposited thereon, in a second processing volume, heating the substrate to an anneal temperature of between about 50° C. and about 450° C., and maintaining the substrate at the anneal temperature for about 30 seconds or more. Herein, the first processing volume is a processing volume of a first processing chamber and the second processing volume is a processing volume a second processing chamber. In some embodiments, the first and second processing chambers are part of a multi-chamber processing system and are coupled by a transfer chamber disposed therebetween.

In another embodiment, a carbon hard mask includes an amorphous carbon layer deposited on a substrate, the amorphous carbon layer thickness between about 1 kÅ and about 40 kÅ, a density of between about 2.0 g/cm$^3$ and about 2.4 g/cm$^3$, a hardness between about 15 GPa and about 20 GPa, an RMS surface roughness of less than about 1.5 nm, an absorption coefficient (optical k) value of less than about 0.3 at a wavelength of about 633 nm, a global compressive film stress of less than about 2000 MPa, and a Young's modulus of between about 100 GPa and about 300 GPa. Herein, a local shape curvature (LSC) nonuniformity across the substrate, having the amorphous carbon layer deposited thereon, is less than about 2 nm/mm$^2$.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments of the present disclosure generally relate to methods of reducing the local stress nonuniformity of an amorphous carbon layer which has been deposited on a substrate using a physical vapor deposition (PVD) process.

Generally, amorphous carbon layers deposited using physical vapor deposition (PVD) processes desirably have a higher density and a greater resistance to an etch precursor used to etch the film underlying the amorphous carbon layer, as compared to carbon films deposited using chemical vapor deposition (CVD) processes. Higher etch resistance to the etch precursor used to etch the film underlying the amorphous carbon layer results in PVD deposited amorphous carbon layers being the preferred carbon hardmask material for etch applications where processes for etching very high aspect ratio openings benefit from hard mask materials high having higher etch selectivity compared to the underlying material layer, for example 3D NAND applications. Unfortunately, amorphous carbon layers deposited using PVD processes may exhibit poor uniformity of local stresses across the surface of the substrate. Non-uniform stress distributions that vary with spatial position across the substrate, such as material layer film stresses that undulate or change in value across the substrate, can elastically locally distort the substrate in the corresponding regions thereof, Conventional lithography systems will often use a linear overlay correction method to correct for elastic distortion caused by a substantially uniform film stress distribution, e.g., global bowing of the substrate. However, these conventional linear overlay correction methods are often insufficient to remove overlay errors caused by out-of-plane undulations of the substrate due to high local stress uniformity of material layers thereon. Therefore, embodiments herein provide methods of annealing a substrate, having an amorphous carbon layer deposited thereon, to desirably reduce variations in local stresses, and thus local stress nonuniformity, in the amorphous carbon layer thereacross.

Typically, the deposition of the amorphous carbon layer and the subsequent anneal process are performed using a multi-chamber processing system (i.e., a cluster tool) which allows for one, or both, of sequential processing operations without exposing the substrate to atmospheric conditions and reduced overall substrate processing time by eliminating the substrate loading and unloading operations that would be used if the anneal chamber was a standalone chamber or part of a separate multi-chamber processing system. In some embodiments, the deposition of the amorphous carbon layer is performed in a processing chamber and the subsequent anneal process is performed in a degas chamber coupled to the processing chamber.

Figure 1:
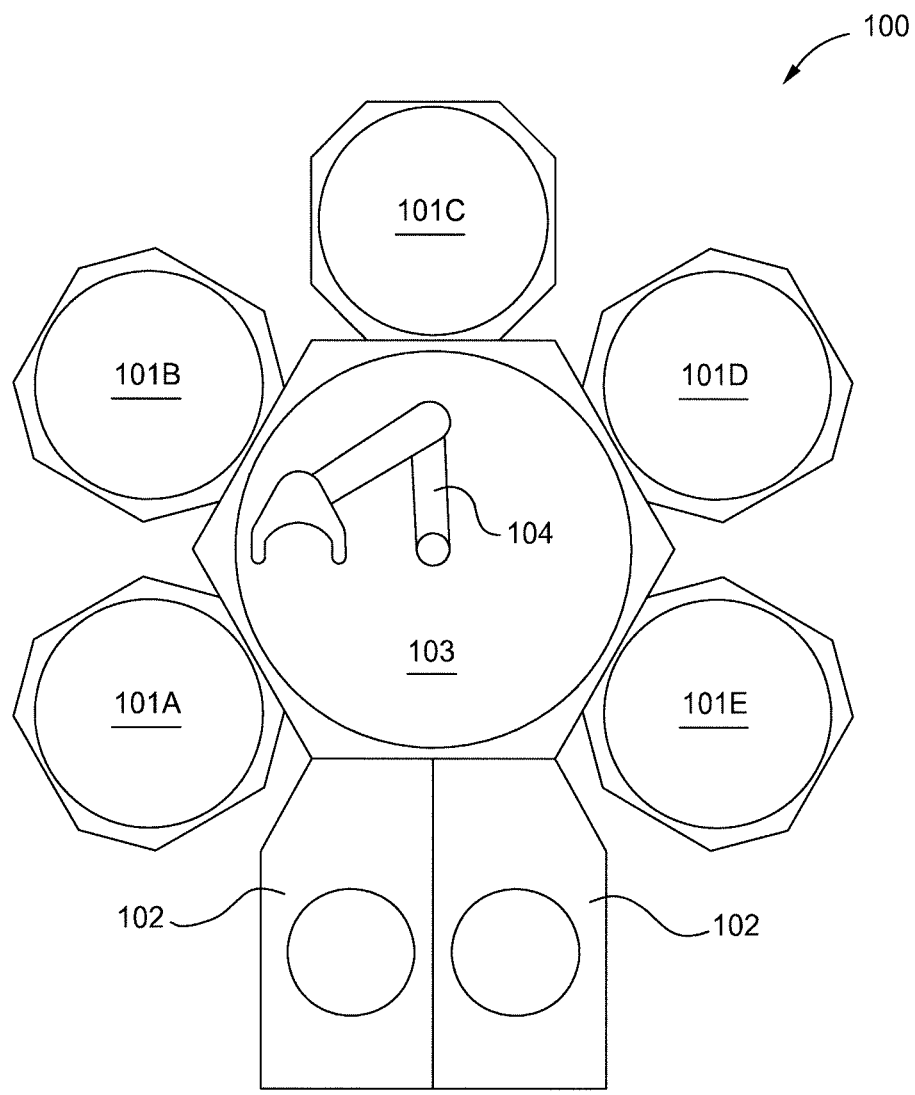
FIG. 1 is a schematic plan view of a multi-chamber processing system used to practice the methods set forth herein, according to one embodiment.

FIG. 1 is a schematic plan view of a multi-chamber processing system used to practice the methods set forth herein, according to one embodiment. Herein, the multi-chamber processing system 100 includes a plurality of processing chambers 101A-E, one or more load lock chambers 102, and a transfer chamber 103 (shown with the cover removed) having a robot handler 104 disposed therein. Typically, at least one of the processing chambers 101A-E is a deposition chamber, such as the exemplary high power impulse magnetron sputtering (HiPIMS) deposition chamber 200 further described in FIG. 2A, and at least one of the processing chambers 101A-E is an anneal chamber, such as the anneal chamber 400 further described in FIG. 4. Other exemplary multi-chamber processing systems that can be used to practice the methods set forth herein include ENDURA® and CHARGER® multi-chamber processing platforms available from Applied Materials, Inc. of Santa Clara, Calif. as well as suitable deposition chambers from other manufacturers.

Herein, the plurality of processing chambers 101A-E are coupled to the transfer chamber 103 which allows for transferring of a substrate between processing chambers, and thus sequential processing of the substrate using more than one processing chamber, without exposing the substrate to atmospheric conditions.

Figure 2:
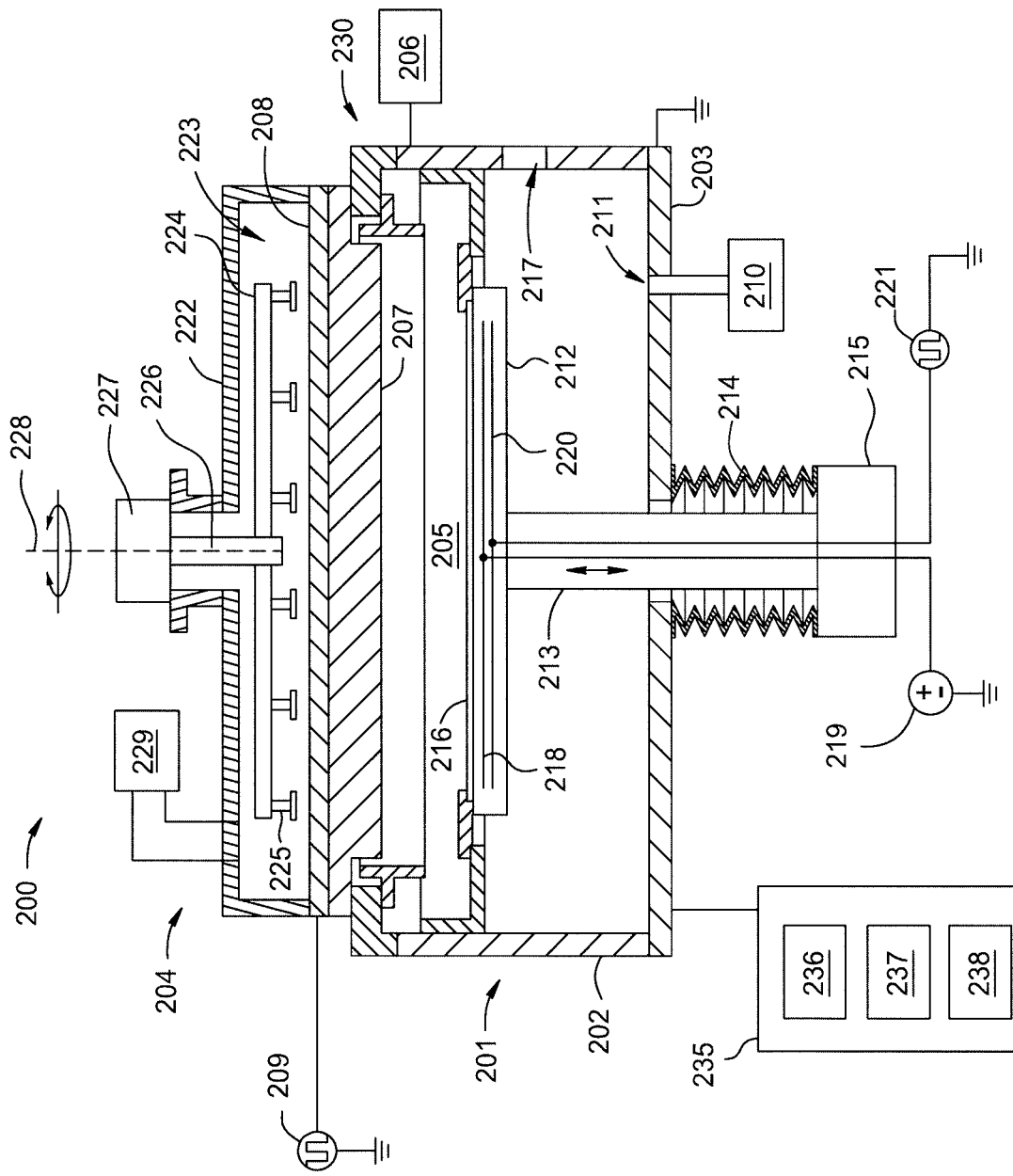
FIG. 2 a schematic cross-sectional view of an exemplary processing chamber, used to practice the methods set forth herein, according to one embodiment.

FIG. 2 a schematic cross-sectional view of an exemplary processing chamber, herein a high power impulse magnetron sputtering (HiPIMS) processing chamber, used to practice the methods set forth herein. The deposition chamber 200 includes a chamber body 201 featuring one or more sidewalls 202, a chamber base 203, and a lid assembly 204, which together define a processing volume 205. The processing volume 205 is fluidly coupled to a gas source 206 which provides processing gases thereinto. A target 207, bonded to a metallic backing plate 208, is disposed in the processing volume 205 and is connected to the lid assembly 204. The backing plate 208 is coupled to a pulsed DC power supply, herein a first power supply 209, which when a pulse therefrom is imposed on the target 207, ignites a plasma composed of the processing gases in the processing volume 205 by capacitive coupling therewith. The processing volume 205 is fluidly coupled to a vacuum source, such as one or more dedicated vacuum pumps 210, through a vacuum outlet 211, to maintain the processing volume 205 at sub-atmospheric pressure and evacuate processing, and other gases, therefrom.

The deposition chamber 200 further includes a substrate support 212 disposed in the processing volume 205 which is coupled to a support shaft 213 extending through the chamber base 203. A bellows 214 circumscribes the support shaft 213 and is coupled to the underside of the chamber base 203 of the deposition chamber 200 and a base plate on the substrate support 212 connected to an actuator 215 to provide a flexible seal therebetween and to maintain the vacuum integrity of the processing volume 205. The actuator 215 raises and lowers the support shaft 213, and thus the substrate support 212 disposed thereon, to facilitate processing of a substrate 216 and locating thereof to transfer thereof to and from the processing volume 205. Typically, when the substrate support 212 is in a raised or substrate processing position, the substrate 216 is spaced apart from a surface of the target 207 by between about 20 mm and about 250 mm, such as between about 40 mm to 60 mm.

Herein, the substrate 216 is transferred into and out of the processing volume 205 through an opening 217 formed through the sidewall 202, which is conventionally sealed with a door or valve (not shown) during substrate processing. Typically, a lift pin system (not shown), having a plurality of lift pins (not shown) disposed through the substrate support 212, is configured to lift the substrate 216 off of the substrate support 212 and enable access to the substrate 216 by a robot handler (not shown) to facilitate transferring of the substrate 216 to and from a surface of the substrate support 212 and in or out of the opening 217.

During processing, the substrate 216 is secured to the surface of the substrate support 212 by means of electrostatic attraction between the substrate 216 and substrate support 212 created as a result of powering a chucking electrode 218 embedded in a dielectric material of the substrate support 212. The chucking electrode 218 is electrically coupled to a second power supply 219. Herein, the second power supply 219 is a static DC power supply which provides between about −5000 V and about 5000 V. The substrate support 212 herein further includes a bias electrode 220, disposed in the dielectric material thereof, which is electrically isolated from the chucking electrode 218 by the dielectric material of the substrate support 212 disposed therebetween. The bias electrode 220 is electrically coupled to a third power supply 221 which is herein an RF power supply that operates in a pulsing or continuous wave (CW) mode. In pulsing mode, the RF bias power provided to the bias electrode typically has a pulse width (pulse duration) of between about 10 µs and about 200 µs, such as between about 10 µs and about 100 µs, such as between about 10 µs and about 50 µs, for example between about 10 µs and about 25 µs. Herein, the pulsed RF bias power has a time on duty cycle between about 10% and about 90%, such as between about 30% and about 70%. Typically, the average RF bias power provided to the bias electrode in pulsing mode or in CW mode is between about 20 W and about 1000 W for a substrate support configured for a 300 mm diameter substrate, such as between about 20 W and about 500 W, for example about 150 W. Appropriate scaling may be used for substrate supports for different sized substrates where the RF bias power per cm$^2$ at a surface of the substrate 216 is between about 0.028 W/cm$^2$ and about 1.415 W/cm$^2$, such as between about 0.028 W/cm$^2$ and about 0.71 W/cm$^2$, for example about 0.21 W/cm$^2$.

In some embodiments, the substrate support 212 is further coupled to a cooling base (not shown) which is used to regulate the temperature of the substrate support 212, and the substrate 216 disposed on the surface thereof, during the deposition process. Typically, the cooling base includes one or more fluid conduits disposed therein which are in fluid communication with a coolant source (not shown) such as a refrigerant source or a temperature controlled fluid source.

The lid assembly 204 herein includes a magnetron housing 222 and the target 207 bonded to the metallic backing plate 208 which define a housing volume 223, a magnetron assembly 224 disposed in the housing volume 223, and a ground shield assembly 230 which electrically insulates the target 207, and the metallic backing plate 208 bonded thereto, from the sidewalls 202 of the chamber body 201. The magnetron assembly 224 herein includes a plurality of high strength magnets 225, such as neodymium iron boride magnets, arranged to provide a magnetic field which extends through the target 207 and into the processing volume 205. magnetic field traps electrons along magnetic field lines to increase the plasma ion density by enabling additional electron-gas atom collisions. The negative bias on the target accelerates sputtering gas ions, such as ions of Argon, in the processing plasma toward the target where they strike the target to knock carbon atoms from the target 207 that can then deposit on the surface of the substrate 216 to form an amorphous carbon layer described herein. In one embodiment, a strength of the magnetic field in the plasma is between about 200 Gauss and about 1000 Gauss, such as between about 200 Gauss and about 500 Gauss, or between about 500 Gauss and about 1000 Gauss, or more than about 200 Gauss, more than about 500 Gauss, or more than about 800 Gauss.

In some embodiments, the lid assembly 204 further includes a motor 227 coupled to the magnetron assembly 224 by a rotatable shaft 226 which rotates to move the magnetron assembly 224 about an axis 228 during the deposition process. Rotating the magnetron assembly 224 during the deposition process desirably moves high ion density regions across the target surface to desirably allow more uniform erosion of carbon material from the face of the target 207 which reduces the nonuniformity of the deposited amorphous carbon layer and desirably extends the useful life of the target 207. Typically, the magnetron assembly 224 is moved about the axis 228 at between about 10 rpm and about 200 rpm, such as between about 40 rpm and about 150 rpm. In other embodiments, the magnetron assembly 224 does not move during the deposition process. In some embodiments, a cooling fluid having a relatively high resistivity is delivered to the housing volume 223 from a cooling fluid source 229 in fluid communication therewith to cool the magnetron assembly 224 and adjacent backing plate 208 and the target 207 bonded thereto.

Herein, the deposition chamber 200 includes a controller 235 coupled thereto. The controller 235 herein includes a central processing unit (CPU) 236, a memory 237, and support circuits 238. The controller 235 is used to control the process sequence, regulate the gas flows from the gas source 206 into the deposition chamber 200, bias the substrate 216 disposed on the substrate support 212, heat/cool and or maintain the substrate support 212 and/or the substrate disposed thereon at a desired temperature, and control ion bombardment of the target 207 by controlling the high voltage pulsed DC power provided to the target 207 and the magnetron housing 222 by the first power supply 209 and by controlling the speed of the magnetron assembly 224 about the axis 228. Herein, the CPU 236 is a general purpose computer processor configured for use in an industrial setting for controlling processing chamber and sub-processors related thereto. The memory 237 herein includes random access memory, read only memory, floppy or hard disk drive, or other suitable forms of digital storage, local or remote. Herein, the support circuits 238 are coupled to the CPU 236 and comprise cache, clock circuits, input/output subsystems, power supplies, and the like, and combinations thereof. In some embodiments, the controller 235 further includes one or more computer readable media (not shown).

Computer readable media herein includes any device, located either locally or remotely from the controller 235, which is capable of storing information that is retrievable by a computing device. Examples of computer readable media useable with embodiments of the present disclosure include solid state memory, floppy disks, internal or external hard drives, and optical memory (CDs, DVDs, BR-D, etc.). In one embodiment, the computer readable media comprises the memory 237. Further, any connection is properly termed a computer-readable medium. For example, when instructions are transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Software routines, when executed by the CPU 236, transform the CPU into a specific purpose computer, herein the controller 235, which controls the operation of the deposition chamber 200, such that the processes are performed in accordance with embodiments of the disclosure. In some embodiments, the software routines are stored and/or executed by a second controller (not shown) which is located remotely from the deposition chamber 200. In other embodiments, the processes described herein, or portions thereof, are performed by one or more application specific integrated circuits (ASIC) or other types of hardware implementations. In some other embodiments, the processes described herein are performed by a combination of software routines, ASIC(s), and/or other types of hardware implementations. In some embodiments, the controller 235 is further used to control the operation of the multi-chamber processing system 100 described in FIG. 1, including the processing chambers coupled thereto.

Figure 3:
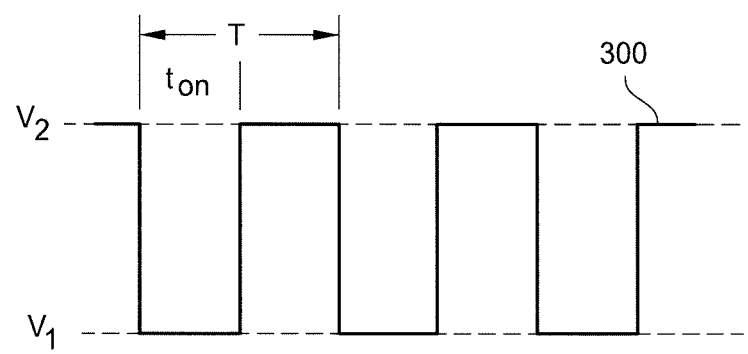
FIG. 3 illustrates a cyclic pulsed DC power applied to a target of the processing chamber described in FIG. 2, according to one embodiment.

FIG. 3 illustrates the time to amplitude relationship of a cyclic pulsed DC power waveform 300, such as the high voltage pulsed DC power waveform provided to the target 207 by the first power supply 209 shown in FIG. 2. Herein, the cyclic pulsed DC power waveform 300 cycles from a first voltage $V_1$ of between about −100 V and about −1400 V to a second voltage $V_2$ of about 0 V. In some embodiments, the second voltage is a positive voltage of more than about 0 V. The cyclic pulsed DC power 300 has a pulse duration, herein pulse active time $t_{on}$, between about 10 ρs and about 40 µs, or less than about 200 µs, such as less than about 100 µs, such as less than about 50 µs, for example less than about 35 µs and a cycle period T. Typically, the cycle period T is less than about 400 µs, such as less than about 300 µs, for example less than about 200 µs or a pulse repetition frequency is more than about 2500 Hz, such as more than about 3300 Hz, for example more than about 5000 Hz. As shown, the cyclic pulsed DC power 300 has a square wave shape, in other embodiments the cyclic pulsed DC power 300 has a non-square wave shape. Herein, an average DC power provided to the target during the pulse active time $t_{on}$ is between about 1 kW and about 11 kW for a target disposed in a processing chamber configured to process 300 mm diameter substrates. Appropriate scaling may be used for targets disposed in processing chambers configured to process different sized substrates where the average DC power during the pulse active time $t_{on}$ per $cm^2$ of a surface of the target is between about 1 $W/cm^2$ and about 20 $W/cm^2$, such as between about 1.4 $W/cm^2$ and about 16 $W/cm^2$.

Figure 4:
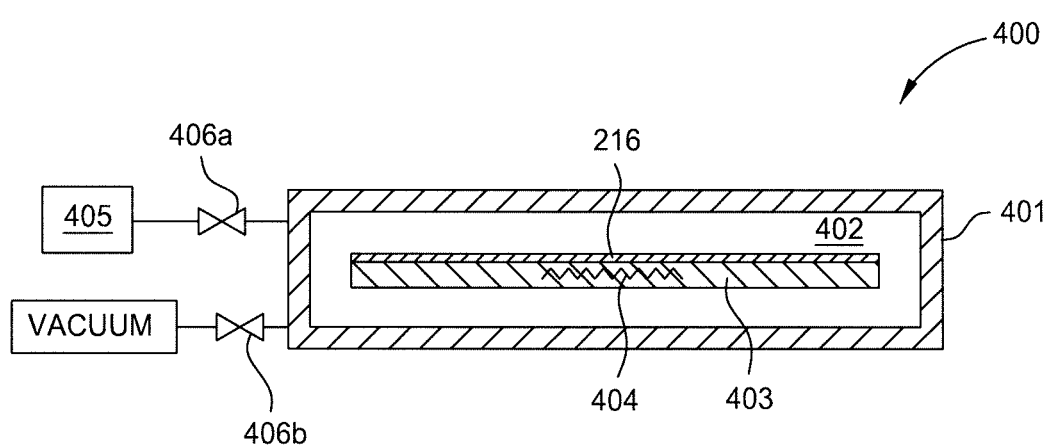
FIG. 4 is a schematic cross-sectional view of an exemplary anneal chamber used to practice the methods set forth herein, according to one embodiment.

FIG. 4 is a schematic cross-sectional view of an exemplary anneal chamber used to practice the methods set forth herein, according to one embodiment. The anneal chamber 400 features a chamber body 401 defining a processing volume 402 and a substrate support 403 disposed in the processing volume. Herein, the anneal chamber is a single substrate processing chamber configured to heat a substrate 216 disposed on the substrate support 403 to a desired temperature using a heat source, such as a resistive heater 404, embedded in the substrate support 403. In some embodiments, the substrate support 403 is a hot plate. In some embodiments (not shown), the heat source is a radiant heat source, such as a plurality of lamps positioned above, below, or both above and below the substrate 216 to radiate heat theretowards. In some other embodiments, the anneal chamber is a batch processing chamber configured to heat a plurality of substrates in a single anneal process sequence.

Herein, the processing volume 402 is fluidly coupled to a gas source 405 and to a vacuum source, such as one or more dedicated vacuum pumps or to a common fab exhaust. In some embodiments, the gas source 405 includes one or more pumps (not shown) that pressurize one or more anneal gases delivered thereto. During substrate processing the processing volume 402 is desirably maintained at a desired pressure through operation of valves 406a and 406b fluidly coupled to the gas source 405 and the vacuum source respectively. In some embodiments, the anneal chamber 400 and the deposition chamber 200 are part of a multi-chamber processing system (i.e., cluster tool), such as the multi-chamber processing system 100 described in FIG. 1. In other embodiments (not shown), the anneal chamber 400 is a standalone chamber or one of a plurality of connected chambers that is coupled to the deposition chamber 200 described in FIG. 2.

Figure 5:
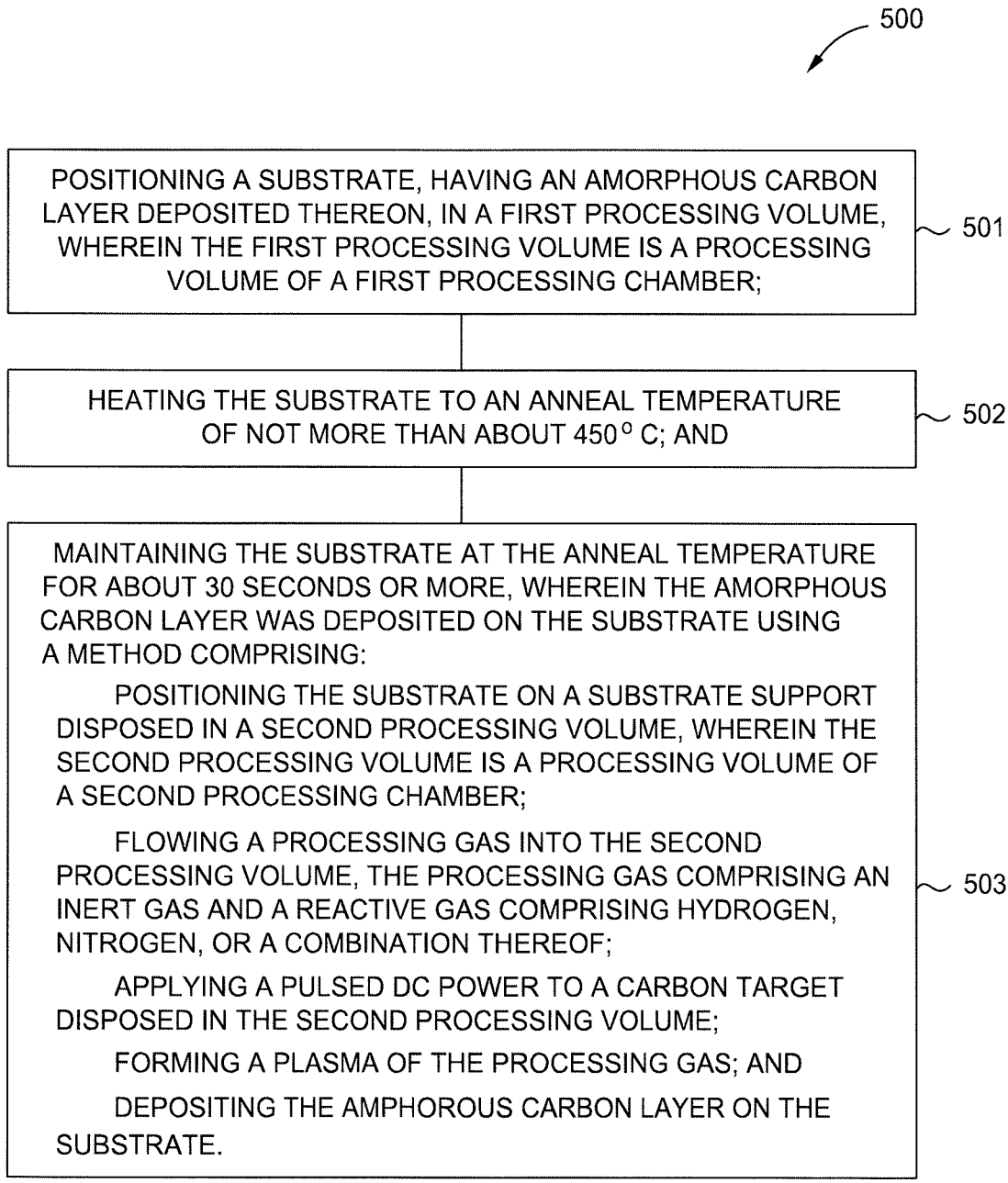
FIG. 5 is a flow diagram of a method of processing a substrate, according to one embodiment.
Figure 6A:
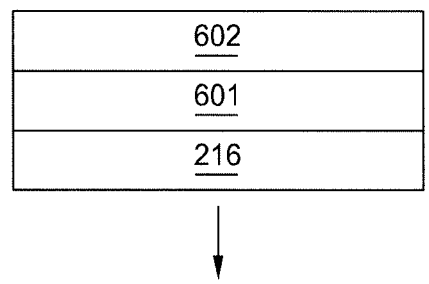
FIGS. 6A-6C illustrate the results of a method of patterning a substrate using the substrate processing method set forth in FIG. 5.
Figure 6B:
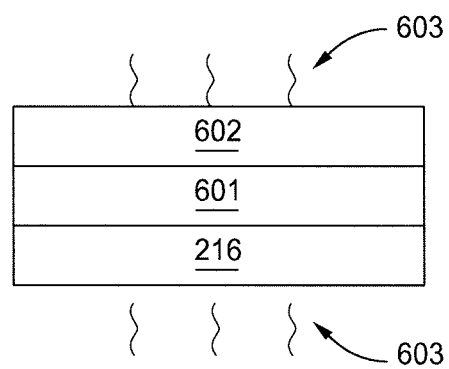
Figure 6C:
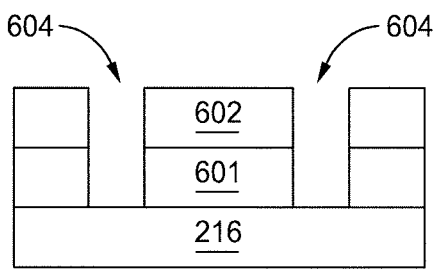

FIG. 5 is a flow diagram of a method of processing a substrate, according to one embodiment. FIGS. 6A-6C illustrate a method of patterning a substrate using the substrate processing method set forth in FIG. 5.

At activity 501 the method 500 includes positioning a substrate, such as the substrate 216 shown in FIG. 6A having an amorphous carbon layer 602 deposited thereon, in a first processing volume. Herein, the first processing volume is a processing volume of a first processing chamber, such as the anneal chamber 400 described in FIG. 4. Typically, one or both of the substrate 216 or one or more material surfaces 601 thereof are formed of a material comprising crystalline silicon, silicon oxide, silicon oxynitride, silicon nitride, strained silicon, silicon germanium, tungsten, titanium nitride, doped or undoped polysilicon, carbon doped silicon oxides, silicon nitrides, doped silicon, germanium, gallium arsenide, glass, sapphire, low k dielectric materials, or combinations thereof. In some embodiments, the material surface 601 of the substrate 216 comprises a low-k dielectric material, such as a low-k carbon containing dielectric layer, a porous silicon oxycarbide low-k, an ultra-low-k dielectric layer, or a combination thereof. In some embodiments, the amorphous carbon layer 602 has a thickness between about 800 Å and about 16 kÅ, for example less than about 2 kÅ, such as less than about 1 kÅ, or more than about 4 kÅ, such as more than about 5 kÅ, or more than about 6 kÅ. In other embodiments, the amorphous carbon layer 602 has a thickness of up to about 40 kÅ, such as between about 1 kÅ and about 40 kÅ, or between about 10 kÅ and about 40 kÅ.

At activity 502 the method 500 includes heating the substrate to an anneal temperature of not more than about 450° C., such as between about 50° C. and about 400° C., between about 50° C. and about 250° C., between about 75° C. and about 225° C., for example between about 100° C. and about 200° C.

At activity 503 the method 500 includes maintaining the substrate at the anneal temperature for about 30 seconds or more, such as between about 30 seconds and about 3 hours, between about 30 seconds and about 60 minutes, between about 30 seconds and about 10 minutes, between about 30 seconds and about 30 minutes, between about 30 seconds and about 5 minutes, or less than about 3 hours, such as less than about 60 minutes, less than about 30 minutes, less than about 10 minutes, or less than about 5 minutes.

In some embodiments, the method 500 further includes flowing an anneal gas into the first processing volume and maintaining the first processing volume at a desired pressure through the duration of activities 502 and 503, or at least through the duration of activity 503. Examples of anneal gases used herein include Ar, He, Kr, forming gas (a mixture of $H_2$ and $N_2$), $N_2$, $O_2$, CO, $CO_2$, and combinations thereof. Typically, the first processing volume is maintained at desired pressure, herein an anneal pressure, of more than about 0.1 bar, such as between about 0.1 bar and about 10 bar, such as between about 0.1 bar and about 5 bar, for example between about 0.5 bar and about 2 bar. In some embodiments, the first processing chamber is a high pressure anneal chamber capable of pressurizing the processing volume to pressures more than about 10 bar, for example up to about 45 bar and the first processing volume is maintained at a pressure of between about 1 bar and about 45 bar, such as between about 1 bar and about 20 bar.

Herein, the amorphous carbon layer was deposited on the substrate using a method which included positioning the substrate on a substrate support disposed in a second processing volume, flowing a processing gas into the second processing volume, applying pulsed DC power to a carbon target disposed in the second processing volume, forming a plasma of the processing gas, and depositing the amorphous carbon layer on the substrate. In some embodiments, the method 500 includes depositing the amorphous carbon layer 602 on the substrate 216 or a material surface 601 thereof.

Herein, the second processing volume is a processing volume of a second processing chamber, such as the deposition chamber 200 described in FIG. 2. Typically, the processing gas used to sputter the target to provide the carbon to form the amorphous carbon layer includes an inert gas, such as Ar, He, Ne, Kr, Xe, or a combination thereof. In some embodiments, the processing gas further includes a reactive gas. In some embodiments, depositing the amorphous carbon layer further includes biasing the substrate. Biasing the substrate desirably improves roughness and optical K (transparency), but increases film stress. Adding a hydrogen source gas, such as hydrogen or a hydrogenated carbon gas, or a nitrogen source gas, such as $N_2$ or $NH_3$, to an inert gas desirable reduces the roughness and desirably reduces film stress of the as deposited amorphous carbon layer when compared to methods that use only an inert gas, such as Kr. Further, the combination of a hydrogen source gas and an inert gas, such as $H_2$ and Kr, improves optical K properties of the resulting film when compared to methods that use only an inert gas or use a hydrogen source gas and an inert gas. The combination of biasing and adding a hydrogen source gas or a nitrogen source gas during the deposition process results in an amorphous carbon layer with higher density, higher etch resistance, lower film roughness, and lower stress when compared to conventional PVD methods.

Typically, the reactive gas comprises hydrogen, nitrogen, or a combination thereof. In some embodiments, the reactive gas comprises a hydrogen source gas such as $H_2$, hydrogenated carbon gas, or a combination thereof, where hydrogenated carbon gases include $CH_4$, $C_2H_2$, $C_3H_8$, $C_4H_{10}$, $C_2H_4$, $C_3H_6$, $C_4H_8$, and $C_5H_{10}$, or a combination thereof. In other embodiments, the reactive gas comprises a nitrogen source gas, such as $N_2$, $NH_3$, or a combination thereof. Typically, the processing gas comprises between about 5% and about 95% hydrogen source gas, nitrogen source gas, or a combination thereof, such as between about 5% and about 50%, such as between about 5% and about 40%, for example between about 20% and about 40% or more than about 20%. In one embodiment, the processing gas comprises Kr and $N_2$ or Kr and $H_2$. Typically, a processing pressure in the second processing volume is maintained between about 1.3 microbar and about 13 microbar, such as less than about 13 microbar, or such as between about 1.3 microbar and about 66 microbar, during the deposition process.

In some embodiments, the pulsed DC power applied to the carbon target disposed in the second processing volume cycles from a first voltage between about −100 V and about −1400 V to a second voltage $V_2$ of about 0 V or more.

Typically, an average pulse duration, herein a pulse active time, of the pulsed DC power is between about 10 µs and about 200 µs. In some embodiments, the average DC power per $cm^2$ of the sputterable surface of the target is between about 1 $W/cm^2$ and about 20 $W/cm^2$, such as between about 1.4 $W/cm^2$ and about 16 $W/cm^2$ for each pulse cycle. In embodiments herein, the target comprises a carbon containing material, such as graphite, amorphous carbon, sp2 type carbon materials, or combinations thereof, which is bonded to a metallic backing plate with an adhesive or by other conventional means.

In some embodiments, forming the plasma in the second processing volume includes providing a bias power to a bias electrode disposed in the dielectric material of the substrate support. In one embodiment, the bias power is a pulsed RF bias power having an average pulse duration of between about 10 µs and about 200 µs, such as between about 10 µs and about 100 µs, such as between about 10 µs and about 50 µs, for example between about 10 µs and about 25 µs and an on-time duty cycle between about 10% and about 90%, such as between about 30% and about 70%. In one embodiment, an average RF bias power per $cm^2$ of a surface of the substrate 216 is between about 0.028 $W/cm^2$ and about 1.415 $W/cm^2$, such as between about 0.028 $W/cm^2$ and about 0.71 $W/cm^2$, for example about 0.21 $W/cm^2$ for each pulse cycle. In other embodiments, the RF bias power is provided in a continuous wave (CW).

In some embodiments, depositing the amorphous carbon layer 602 includes maintaining the substrate 216 at a temperature of 200° C. or less, such as between about −50° C. and about 200° C., between about −50° C. and about 100° C., or between about −50° C. and about 50° C.

In some embodiments, the method 500 further includes depositing a patterning layer (not shown) on the amorphous carbon layer 602. Herein, the patterning layer is deposited in a different deposition chamber, such as a CVD chamber of PVD chamber (i.e., a third processing chamber), than the deposition chamber used to deposit the amorphous carbon layer. Typically, the patterning layer comprises silicon oxide, silicon nitride, amorphous silicon, or a combination thereof. In some embodiments, the deposition chamber used to deposit the amorphous carbon layer, the anneal chamber, and the deposition chamber used to deposit the patterning layer are part of the same multi-chamber processing system (i.e., cluster tool), such as the multi-chamber processing system 100 described in FIG. 1. In some embodiments, the method 500 further includes forming a plurality of openings (not shown) through the patterning layer (not shown) using conventional lithography and etch processes. The plurality of openings in the patterning layer are then extended through the amorphous carbon layer 602 to form a pattern (i.e., the plurality of openings 604 in the amorphous carbon layer 602) and are further extended through the underlying material surface 601 as shown in FIG. 6C.

Figure 7A:
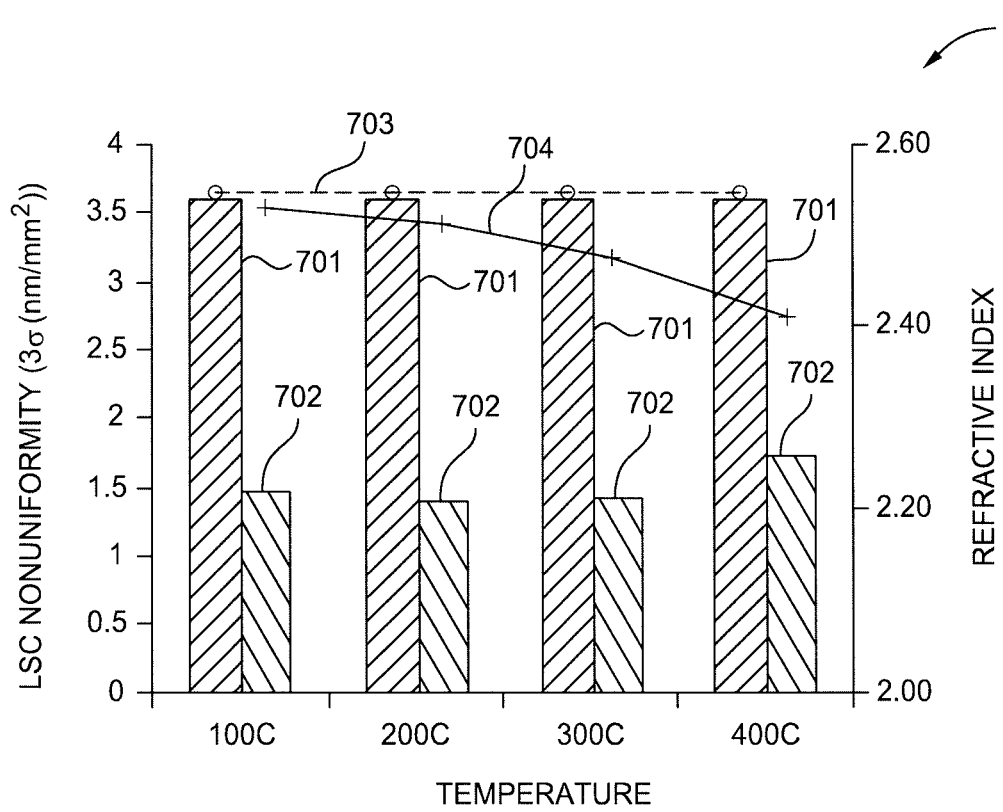
FIGS. 7A and 7B compare the local stress nonuniformity of substrates, having amorphous carbon layers deposited thereon, before and after annealing the substrates using the methods described herein.
Figure 7B:
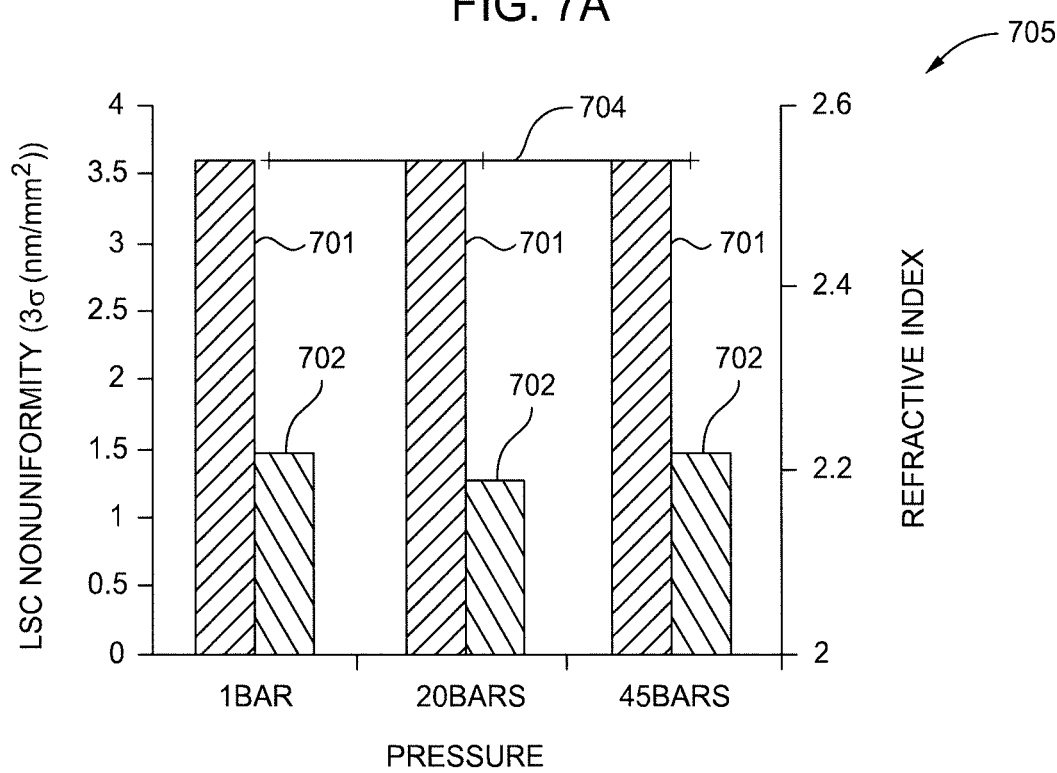

FIGS. 7A and 7B compare the local shape curvature (LSC) uniformity of 300 mm diameter substrates, each having an amorphous carbon layers deposited thereon, before and after annealing the substrates using the methods described herein. The LSC uniformity metric is a shape-curvature-change metric conventionally used to predict process induced local stresses on a substrate, such as the local stress nonuniformities described herein. The amorphous carbon layers in FIGS. 7A and 7B were deposited to a thickness of about 1000 Å using a HiPIMS process, such as the HiPIMS process described herein.

In FIG. 7A each of four substrates were maintained at a desired anneal temperature in an $N_2$ environment at 45 bars for 10 minutes. Pre-anneal LSC nonuniformity 701 and post-anneal LSC nonuniformity 702 values were determined for each of the four substrates processed at anneal temperatures of 100° C., 200° C., 300° C., and 400° C. respectively and are shown in the chart 700. The pre-anneal refractive index 703 and the post-anneal refractive index 704 of the amorphous carbon layers on each of the four respective substrates are also shown on chart 700. Generally, an amorphous carbon layer having a higher refractive index will also have a higher film density when compared to an amorphous carbon layer having a lower refractive index. Higher film densities in amorphous carbon hard masks desirably result in decreased deformation of high aspect ratio features formed in the underlying substrate or material layer when compared to high aspect ratio features formed using lower density amorphous carbon hard masks. As shown, annealing the substrates, and thus the amorphous carbon layers deposited thereon, resulted in a more than 2× reduction in LSC nonuniformity for each of the substrates processed at anneal temperatures of 100° C., 200° C., 300° C., and 400° C. respectively. Further, the refractive index of the amorphous carbon layers processed at temperatures of 200° C. and below did not significantly change (e.g., <5% change) from pre-anneal 703 to post anneal 704 indicating that anneal temperatures of about 200° C. or below can be used to reduce local stress nonuniformity without significantly reducing film density. Table 1 further shows global substrate bow measurements pre and post anneal for each of the four substrates processed at the anneal temperatures of 100° C., 200° C., 300° C., and 400° C. respectively.

TABLE 1

| Anneal Temperature (° C.) | Pre-Anneal Substrate Bow (μm) | Post-Anneal Substrate Bow (μm) |
|---|---|---|
| 100 | 115.59 | 115.80 |
| 200 | 115.20 | 115.59 |
| 300 | 115.61 | 119.59 |
| 400 | 116.4 | 127.31 |

In FIG. 7B each of three substrates were maintained at a desired anneal pressure and an anneal temperature of 100° C. in an $N_2$ environment for 10 minutes. Pre-anneal LSC nonuniformity 701 and post-anneal LSC nonuniformity 702 values were determined for each of three substrates processed at anneal pressures of 1 bar, 20 bars, and 45 bars respectively and are shown in chart 705. The post-anneal refractive index 704 of the amorphous carbon layers on each of the three respective substrates is also shown on chart 705. The post-anneal refractive index 704 of the amorphous carbon layers on each of the respective substrates varied less than 1 from the pre-anneal refractive index (not shown). As shown, annealing the substrates at an anneal temperature of 100° C. results a more than 2× reduction in LSC nonuniformity for each of the substrates processed at 1 bar, 20 bars, and 45 bars and less than 1% change in refractive index.

FIGS. 7A and 7B collectively show that the methods provided herein can be used to improve the LSC nonuniformity of a substrate, and thus the local stress nonuniformity of an amorphous carbon layer, without undesirably reducing the density of the amorphous carbon layer or undesirably increasing the global bow of the substrate.

In other embodiments, a carbon hard mask is provided. The carbon hard mask comprises an amorphous carbon layer disposed on a substrate, wherein the amorphous carbon layer has a thickness between 1 kÅ and about 40 kÅ, such as between about 1 kÅ and about 16 kÅ or between about 10 kÅ and about 40 kÅ, a density of between about 2.0 g/cm³ and about 2.4 g/cm³, a hardness between about 15 GPa and about 20 GPa, an RMS surface roughness of less than about 1.5 nm, an absorption coefficient (optical k) value of less than about 0.3 at a wavelength of about 633 nm, a global compressive film stress of less than about 2000 MPa, a Young's modulus of between about 100 GPa and about 300 GPa, a substantially columnar free morphology, and a local stress nonuniformity across a substrate of less than about 2%. In some embodiments, the amorphous carbon layer has a hardness of more than about 15 GPa, such as more than about 16 GPa, for example more than about 17 GPa. In some embodiments, the amorphous carbon layer has an RMS surface roughness less than about 1 nm, less than about 0.5 nm, for example less than about 0.25 nm. In some embodiments, the amorphous carbon layer has an absorption coefficient (optical k) value of less than about 0.25 at a wavelength of about 633 nm, less than about 0.20, for example less than about 0.17, or about equal to 0.15. In some embodiments, the amorphous carbon layer has a global compressive film stress between about 1000 MPa and about 2000 MPa, such as between about 1000 MPA and about 1500 MPA, such as less than about 1500 MPa, or less than about 1200 MPa. Herein, the amorphous carbon layer has a Young's modulus of between about 150 GPa and about 250 GPa, or more than about 150 GPa, or less than about 250 GPa. In some embodiments, the amorphous carbon layer has a refractive index of not less than about 2.4, such as not less than about 2.5. In some embodiments, the amorphous carbon layer has a plurality of openings formed therethrough, wherein each of the plurality of openings have an aspect ratio (height to width) of more than about 2:1, such as more than about 3:1, more than about 4:1, more than about 5:1, more than about 6:1, more than about 7:1, more than about 8:1, more than about 9:1, for example more than about 10:1.

The methods described above result in reduced variations in local stresses, and thus local stress nonuniformity, in an amorphous carbon layer deposited on a substrate. Reduced local stress nonuniformity of the amorphous carbon layer will desirably reduce or eliminate local shape curvature (LSC) nonuniformities that undesirably cause localized pattern distortions and pattern overlay error in subsequent lithography processes. Further, the annealing processes described herein may be performed in the same multi-chamber substrate processing system as used to deposit the amorphous carbon layer without exposing the substrate to atmospheric conditions. Annealing the substrate in the same multi-chamber substrate processing system used to deposit the amorphous carbon layer desirably reduces substrate processing time by eliminating redundant loading and unloading operations that would be used if the anneal chamber was a standalone chamber or part of a separate multi-chamber processing system.

While the foregoing is directed to embodiments of the present disclosure, other and further embodiments of the disclosure may be devised without departing from the basic scope thereof, and the scope thereof is determined by the claims that follow.

The invention claimed is:
1. A method of processing a substrate, comprising:
 positioning a substrate, having an amorphous carbon layer deposited thereon, in a first processing volume, wherein the first processing volume is a processing volume of a first processing chamber;
 flowing an anneal gas into the first processing volume;

heating the substrate to an anneal temperature, wherein the anneal temperature is between about 50° C. and about 250° C.; and maintaining the substrate at the anneal temperature for less than about 30 minutes, wherein the amorphous carbon layer was deposited on the substrate using a method comprising:

positioning the substrate on a substrate support disposed in a second processing volume, wherein the second processing volume is a processing volume of a second processing chamber;

flowing a processing gas into the second processing volume;

applying a pulsed DC power to a carbon target disposed in the second processing volume;

forming a plasma of the processing gas; and depositing the amorphous carbon layer on the substrate.

2. The method of claim 1, wherein the first processing chamber is coupled to the second processing chamber by a transfer chamber disposed therebetween.

3. The method of claim 1, wherein the anneal gas comprises Ar, He, Kr, $H_2$, $N_2$, $O_2$, CO, $CO_2$, or a combination thereof.

4. The method of claim 1, further comprising maintaining the first processing volume at a processing pressure between about 0.1 bar and about 10 bar.

5. The method of claim 1, wherein depositing the amorphous carbon layer further comprises maintaining the substrate at a temperature less than about 200° C.

6. The method of claim 1, wherein the processing gas comprises an inert gas and a reactive gas comprising hydrogen, nitrogen, or a combination thereof.

7. The method of claim 1, wherein the second processing chamber comprises a chamber lid assembly, comprising:

the carbon target bonded to a metallic backing plate;

a magnetron housing coupled to the metallic backing plate, wherein the metallic backing plate and the magnetron housing define a housing volume;

a magnetron assembly disposed in the housing volume; and a motor coupled to the magnetron assembly by a rotatable shaft.

8. The method of claim 7, wherein an average pulse active time of the pulsed DC power is between about 10 μs and about 200 μs.

9. The method of claim 7, wherein the pulsed DC power cycles between a first voltage between about −100 V and about −1400 V and a second voltage of about 0 V or more.

10. The method of claim 9, wherein an average DC power applied to the carbon target during a pulse active time is between about 1 W/cm² and about 20 W/cm².

11. A method of processing a substrate, comprising:
depositing an amorphous carbon layer, comprising:

positioning a substrate on a substrate support disposed in a first processing volume, wherein the first processing volume is a processing volume of a first processing chamber;

flowing a processing gas into the first processing volume, wherein the processing gas comprises an inert gas and a reactive gas comprising hydrogen, nitrogen, or a combination thereof;

maintaining the substrate at a deposition temperature of about 200° C. or less;

applying pulsed DC power to a carbon target disposed in the first processing volume;

forming a plasma of the processing gas; and depositing the amorphous carbon layer on the substrate; and annealing the substrate, comprising:

positioning the substrate, having the amorphous carbon layer deposited thereon, in a second processing volume, wherein the second processing volume is a processing volume a second processing chamber;

heating the substrate to an anneal temperature, wherein the anneal temperature is between about 50° C. and about 250° C.; and maintaining the substrate at the anneal temperature for less than about 30 minutes.

12. The method of claim 11, wherein the first processing chamber is coupled to the second processing chamber by a transfer chamber disposed therebetween.

13. The method of claim 11, wherein the first processing chamber comprises a chamber lid assembly, comprising:

the carbon target bonded to a metallic backing plate;

a magnetron housing coupled to the metallic backing plate, wherein the metallic backing plate and the magnetron housing define a housing volume;

a magnetron assembly disposed in the housing volume; and a motor coupled to the magnetron assembly by a rotatable shaft.

14. The method of claim 13, wherein the pulsed DC power cycles between a first voltage between about −100 V and about −1400 V and a second voltage of about 0 V or more.

15. The method of claim 14, wherein an average pulse active time of the pulsed DC power is between about 10 μs and about 200 μs.

16. The method of claim 15, wherein an average DC power applied to the carbon target during a pulse active time is between about 1 W/cm² and about 20 W/cm².

17. The method of claim 1, wherein a local shape curvature (LSC) nonuniformity across the substrate is less than about 2 nm/mm² after the substrate has been maintained at the anneal temperature for about 30 seconds or more.

* * * * *